(12) United States Patent
Hines

(10) Patent No.: US 7,622,666 B2
(45) Date of Patent: *Nov. 24, 2009

(54) PHOTOVOLTAIC CONCENTRATOR MODULES AND SYSTEMS HAVING A HEAT DISSIPATING ELEMENT LOCATED WITHIN A VOLUME IN WHICH LIGHT RAYS CONVERGE FROM AN OPTICAL CONCENTRATING ELEMENT TOWARDS A PHOTOVOLTAIC RECEIVER

(75) Inventor: Braden E. Hines, Pasadena, CA (US)

(73) Assignee: Soliant Energy Inc., Monrovia, CA (US)

( * ) Notice: Subject to any disclaimer, the term of this patent is extended or adjusted under 35 U.S.C. 154(b) by 189 days.

This patent is subject to a terminal disclaimer.

(21) Appl. No.: 11/454,441

(22) Filed: Jun. 15, 2006

(65) Prior Publication Data

US 2006/0283497 A1 Dec. 21, 2006

Related U.S. Application Data

(60) Provisional application No. 60/691,319, filed on Jun. 16, 2005.

(51) Int. Cl.
*H02N 6/00* (2006.01)
*H01L 31/042* (2006.01)

(52) U.S. Cl. ...................... 136/246; 136/259
(58) Field of Classification Search .................. 136/246, 136/259

See application file for complete search history.

(56) References Cited

U.S. PATENT DOCUMENTS

| | | |
|---|---|---|
| 3,388,739 A | 6/1968 | Olson et al. |
| 3,957,031 A | 5/1976 | Winston |
| 4,000,734 A | 1/1977 | Matlock et al. |
| 4,002,499 A | 1/1977 | Winston |
| 4,003,638 A | 1/1977 | Winston |
| 4,022,186 A | 5/1977 | Northrup, Jr. |
| 4,067,764 A | 1/1978 | Walker et al. |
| 4,069,812 A | 1/1978 | O'Neill |
| 4,092,531 A | 5/1978 | Moss |
| 4,107,521 A | 8/1978 | Winders |
| 4,131,485 A | 12/1978 | Meinel et al. |
| 4,146,785 A | 3/1979 | Neale |
| 4,158,356 A | 6/1979 | Wininger |
| 4,168,696 A | 9/1979 | Kelly |
| 4,169,738 A | 10/1979 | Luque |
| 4,177,083 A | 12/1979 | Kennedy |

(Continued)

FOREIGN PATENT DOCUMENTS

| | | |
|---|---|---|
| DE | 4116894 | 11/1992 |
| DE | 9412438 | 6/1995 |
| DE | 10150176 | 4/2003 |
| EP | 0 474349 A2 | 3/1992 |
| EP | 1041628 | 10/2000 |
| FR | 2291506 | 6/1976 |
| FR | 2447017 | 8/1980 |
| FR | 2527748 | 12/1983 |
| JP | 56023666 | 3/1981 |
| JP | 56058278 | 5/1981 |

(Continued)

OTHER PUBLICATIONS

Swanson, "The Promise of Concentrators," Prog. Photovolt. Res. Appl., vol. 8, pp. 93-111 (2000).
Kurtz and Friedman, "Photovoltaics-Lighting the Way to a Brighter Future," Optics & Photons News, pp. 30-35, Jun. 2005.
http://www.bctia.org/files/PDF/green_buildings/
Potential_of_Solar_Photovoltaics_-_Day4_-_Mar06.pdf, "Day 4 Energy Inc., Realizing the full potential of Solar Photovoltaics Today," 9 pages.

(Continued)

*Primary Examiner*—Nam X Nguyen
*Assistant Examiner*—J. Christopher Ball
(74) *Attorney, Agent, or Firm*—Kagan Binder, PLLC

(57) ABSTRACT

The present invention relates to photovoltaic power systems, photovoltaic concentrator modules, and related methods.

26 Claims, 17 Drawing Sheets

U.S. PATENT DOCUMENTS

| | | | |
|---|---|---|---|
| 4,184,482 | A | 1/1980 | Cohen |
| 4,187,123 | A | 2/1980 | Diggs |
| 4,191,164 | A | 3/1980 | Kelly |
| 4,210,121 | A | 7/1980 | Stark |
| 4,211,212 | A | 7/1980 | Braun |
| 4,215,410 | A | 7/1980 | Weslow et al. |
| 4,223,174 | A | 9/1980 | Moeller |
| 4,238,246 | A | 12/1980 | Genequand et al. |
| 4,253,880 | A | 3/1981 | Bellugue |
| 4,256,364 | A | 3/1981 | Minoura et al. |
| 4,262,195 | A | 4/1981 | White et al. |
| 4,269,168 | A | 5/1981 | Johnson |
| 4,280,853 | A | 7/1981 | Palazzetti et al. |
| 4,287,411 | A | 9/1981 | Beucci |
| 4,296,731 | A | 10/1981 | Cluff |
| 4,297,521 | A | 10/1981 | Johnson |
| 4,307,711 | A | 12/1981 | Doundoulakis |
| 4,320,288 | A | 3/1982 | Schlarlack |
| 4,323,052 | A | 4/1982 | Stark |
| 4,328,789 | A | 5/1982 | Nelson |
| 4,349,733 | A | 9/1982 | Beam et al. |
| 4,354,484 | A | 10/1982 | Malone et al. |
| 4,365,617 | A | 12/1982 | Bugash et al. |
| 4,397,303 | A | 8/1983 | Stultz |
| 4,398,053 | A | 8/1983 | Orillion |
| 4,410,757 | A | 10/1983 | Stamminger et al. |
| 4,459,972 | A | 7/1984 | Moore |
| 4,476,854 | A | 10/1984 | Baer |
| 4,484,334 | A | 11/1984 | Pressley |
| 4,495,408 | A | 1/1985 | Mori |
| 4,554,038 | A | 11/1985 | Allard |
| 4,556,788 | A | 12/1985 | Hanak |
| 4,572,161 | A | 2/1986 | Mori |
| 4,575,639 | A | 3/1986 | Rogow et al. |
| 4,601,282 | A | 7/1986 | Mountain |
| 4,604,494 | A * | 8/1986 | Shepard, Jr. ............... 136/246 |
| 4,619,244 | A | 10/1986 | Marks |
| 4,622,470 | A | 11/1986 | Makino et al. |
| 4,750,943 | A | 6/1988 | Nelson |
| 4,771,764 | A | 9/1988 | Cluff |
| 4,868,379 | A | 9/1989 | West |
| 4,945,731 | A | 8/1990 | Parker et al. |
| 4,968,355 | A | 11/1990 | Johnson |
| 4,995,377 | A | 2/1991 | Eiden |
| 4,999,483 | A | 3/1991 | Okamoto |
| 5,255,666 | A | 10/1993 | Curchod |
| 5,317,145 | A | 5/1994 | Corio |
| 5,483,060 | A | 1/1996 | Sugiura et al. |
| 5,498,297 | A | 3/1996 | O'Neill et al. |
| 5,665,174 | A | 9/1997 | Laing et al. |
| 5,727,585 | A | 3/1998 | Daume et al. |
| 5,806,955 | A | 9/1998 | Parkyn, Jr. et al. |
| 5,977,475 | A | 11/1999 | Hibino |
| 6,020,554 | A | 2/2000 | Kaminar et al. |
| 6,058,930 | A | 5/2000 | Shingleton |
| 6,079,408 | A | 6/2000 | Fukuda |
| 6,087,646 | A | 7/2000 | Didinsky |
| 6,089,224 | A | 7/2000 | Poulek |
| 6,113,342 | A | 9/2000 | Smith et al. |
| 6,127,620 | A | 10/2000 | Tange et al. |
| 6,498,290 | B1 | 12/2002 | Lawheed |
| 6,531,653 | B1 | 3/2003 | Glenn et al. |
| 6,620,995 | B2 | 9/2003 | Vasylyev et al. |
| 6,691,701 | B1 | 2/2004 | Roth |
| 6,700,054 | B2 | 3/2004 | Cherney et al. |
| 6,717,045 | B2 | 4/2004 | Chen |
| 6,809,413 | B1 | 10/2004 | Peterson et al. |
| 6,843,573 | B2 | 1/2005 | Rabinowitz et al. |
| 6,848,442 | B2 | 2/2005 | Haber |
| 6,870,087 | B1 | 3/2005 | Gallagher |
| 6,881,893 | B1 | 4/2005 | Cobert |
| 6,903,261 | B2 | 6/2005 | Habraken et al. |
| 6,959,993 | B2 | 11/2005 | Gross et al. |
| 6,963,437 | B2 | 11/2005 | Bauer et al. |
| 6,971,756 | B2 | 12/2005 | Vasylyev et al. |
| 7,076,965 | B2 | 7/2006 | Lasich |
| 7,109,461 | B2 | 9/2006 | Lasich |
| 7,156,088 | B2 | 1/2007 | Luconi |
| 7,188,964 | B2 | 3/2007 | Ealey |
| 7,192,146 | B2 | 3/2007 | Gross et al. |
| 7,218,998 | B1 | 5/2007 | Neale |
| 7,403,278 | B2 | 7/2008 | Hayashi et al. |
| 7,535,071 | B2 | 5/2009 | Schell et al. |
| 2003/0169200 | A1 * | 9/2003 | Urban et al. ........... 342/357.06 |
| 2003/0201007 | A1 | 10/2003 | Fraas et al. |
| 2003/0201008 | A1 | 10/2003 | Lawheed |
| 2004/0187907 | A1 | 9/2004 | Morgal |
| 2004/0216734 | A1 | 11/2004 | Lawheed |
| 2005/0081908 | A1 | 4/2005 | Stewart |
| 2005/0126560 | A1 | 6/2005 | Litwin |
| 2005/0229924 | A1 | 10/2005 | Luconi et al. |
| 2005/0241692 | A1 | 11/2005 | Rubin et al. |
| 2006/0054211 | A1 | 3/2006 | Meyers |
| 2006/0054212 | A1 | 3/2006 | Fraas et al. |
| 2006/0060188 | A1 | 3/2006 | Hickerson |
| 2006/0283495 | A1 | 12/2006 | Gibson |
| 2007/0070531 | A1 | 3/2007 | Lu |
| 2007/0089777 | A1 | 4/2007 | Johnson, Jr. et al. |
| 2007/0102037 | A1 | 5/2007 | Irwin |
| 2007/0108459 | A1 | 5/2007 | Lu |
| 2007/0188876 | A1 | 8/2007 | Hines et al. |
| 2007/0193620 | A1 * | 8/2007 | Hines et al. ................. 136/246 |
| 2007/0272234 | A1 | 11/2007 | Allen et al. |
| 2008/0023061 | A1 | 1/2008 | Clemens et al. |
| 2008/0078380 | A1 | 4/2008 | Kimura et al. |
| 2008/0083405 | A1 | 4/2008 | Kimura et al. |
| 2008/0127967 | A1 | 6/2008 | Kimura et al. |
| 2008/0185032 | A1 | 8/2008 | MacDonald |

FOREIGN PATENT DOCUMENTS

| | | |
|---|---|---|
| JP | 58098984 | 6/1983 |
| JP | 06085301 | 3/1994 |
| JP | 06085304 | 3/1994 |
| JP | 2002141543 | 5/2002 |
| JP | 2002151711 | 5/2002 |
| WO | WO 90/04142 | 4/1990 |
| WO | WO 00/68628 | 11/2000 |
| WO | WO 01/63665 | 8/2001 |
| WO | WO 2004/114419 | 12/2004 |
| WO | WO 2005/090873 | 9/2005 |
| WO | WO 2005/119133 | 12/2005 |
| WO | WO 2006/114457 | 11/2006 |
| WO | WO 2006/120475 | 11/2006 |
| WO | WO 2007/041018 | 4/2007 |

OTHER PUBLICATIONS

Burge et al., "Lightweight Mirror Technology Using a Thin Facesheet With Active Rigid Support," Proc. SPIE 3356, Space Telescopes and Instruments V, pp. 690-701, 1998.

Cho et al., "Optimization of the ATST Primary Mirror Support System," Proc. SPIE 6273, Optomechanical Technologies for Astronomy, 2006.

http://www.nrel.gov/docs/fy99osti/25410.pdf (Kurtz et al., "Concentrator and Space Applications of High-Efficiency Solar Cells—Recent Developments," Presented at the National Center for Photovoltaics Program Review Meeting, Denver, Colorado, Sep. 1998) 9 pages.

Richman, R.H. et al., "Investigation of high-concentration photovoltaic cell packages after three years field service," Solar Energy Materials and Solar Cells 30, No. 3, pp. 263-276, Aug. 1993.

* cited by examiner

PHOTOVOLTAIC CONCENTRATOR MODULES AND SYSTEMS HAVING A HEAT DISSIPATING ELEMENT LOCATED WITHIN A VOLUME IN WHICH LIGHT RAYS CONVERGE FROM AN OPTICAL CONCENTRATING ELEMENT TOWARDS A PHOTOVOLTAIC RECEIVER

PRIORITY CLAIM

The present nonprovisional patent Application claims priority under 35 USC §119(e) from U.S. Provisional Patent Application having Ser. No. 60/691,319, filed on Jun. 16, 2005, and titled PLANAR CONCENTRATING PHOTOVOLTAIC SOLAR PANEL WITH INDIVIDUALLY ARTICULATING CONCENTRATOR ELEMENTS, wherein the entirety of said provisional patent application is incorporated herein by reference.

FIELD OF THE INVENTION

The present invention relates to photovoltaic power systems, photovoltaic concentrator modules, and related methods.

BACKGROUND OF THE INVENTION

Solar panels are generally well known. It is desirable to produce solar panels that either produce more power and/or that cost less.

One approach has been to attempt to produce more power per panel by using more efficient solar cells such as by changing a product design from using a cell that is, say, 25% efficient to one that is, say, 37% efficient.

Another approach has been to concentrate sunlight, so that a smaller solar cell can be used, while still producing approximately the same power. Prior art has developed photovoltaic solar concentrators that have attempted to make use of this principle to varying degrees.

To date, photovoltaic solar concentrators have generally taken one of two approaches—either build a large reflective trough or dish or a field of articulating mirrors which reflect light to a central point, where it is converted to power (such as by Solar Systems of Victoria, Australia and by Gross et al., U.S. Pat. No. 2005/0034751), or tightly pack a large number of small concentrators into a large panel which articulates rigidly to follow the sun (such as by Chen, U.S. Pub. No. 2003/0075212 or Stewart, U.S. Pub. No. 2005/0081908). See also the Matlock et al. reference (U.S. Pat. No. 4,000,734), which discloses elongated reflectors mounted for movement around a heating tube arranged in the linear focus of the reflectors and a tracking mechanism.

A recent third approach that has appeared in the prior art (Fraas et al., U.S. Pub. No. 2003/0201007) is to attempt to combine the advantages of concentration with the convenience of the form factor of an ordinary solar panel. Fraas et al, show multiple approaches that attempt to solve the cost/performance/convenience problem.

An approach to produce a flat solar concentrator was to place rows of small concentrators in a "lazy susan" rotating ring (Cluff, U.S. Pat. No. 4,296,731).

SUMMARY OF THE INVENTION

The present invention provides numerous solutions helpful singly or in combination to overcome and/or alleviate one or more of the problems present in prior art solar concentrators.

For example, the present invention can provide a concentrating solar panel that in preferred embodiments may be approximately the size of traditional solar panels. As another example, the present invention can produce as much or more power than an equivalently-sized solar panel in many representative embodiments.

As yet another example, the present invention can allow the use of traditional flat-panel installation techniques if desired.

As yet another example, rather than packing the individual concentrators right next to each other, many embodiments of the present invention may leave some amount of space between the individual concentrators if desired, so that they are free to move in place and track the sun, and so that they operate without shading each other through a larger portion of the day and of the year. This innovation would allow the panel to lie flat on the roof rather than having to point the entire panel at the sun and would allow a more cost-effective use of the individual concentrators by increasing their overall daily exposure to sunlight.

These innovations are important breakthroughs, because they will allow concentrating solar panels, with their higher efficiencies and lower costs, to penetrate markets currently dominated by traditional flat-panel solar, greatly reducing cost and increasing the acceleration of deployment of solar into the market. In preferred embodiments, this allows current flat-panel solar installers to use their existing mounting hardware and installation techniques, and even sales and marketing techniques, to deploy concentrating solar. Thus the invention combines the advantages (e.g., cost advantages) of concentrating solar with the market acceptance and form factor advantages of traditional flat photovoltaic panels.

According to one aspect of the present invention, a photovoltaic power system includes a support structure, a plurality of photovoltaic concentrator modules, and a source of self-power. The plurality of photovoltaic concentrator modules are coupled to the support structure such that a module is moveable relative to the support structure. The support structure includes at least one interface that is structured to mate with existing solar panel mounting hardware. Each module comprises at least one photovoltaic receiver and at least one optical concentrator which optically concentrates incident light onto at least one corresponding photovoltaic receiver. The source of self-power is operatively coupled to the photovoltaic power system.

According to another aspect of the present invention, a photovoltaic power system includes a support structure, a plurality of photovoltaic concentrator modules, and a heat-dissipating element. The plurality of photovoltaic concentrator modules are supported by the support structure in a manner such that a module is independently moveable with respect to the support structure. Each module includes at least one photovoltaic receiver and at least one optical element that concentrates incident light onto at least one corresponding photovoltaic receiver. The heat-dissipating element includes at least one fin that is parallel to the optical axis of an optical element of a module. The heat dissipating element is located at least partially within a volume of the module which is swept out by the module as it articulates, intersected with the volume of the concentrator in which incident light rays are present in the optical system.

According to yet another aspect of the present invention, a photovoltaic concentrator module includes at least one photovoltaic receiver, at least one optical element, and a heat-dissipating element. At least one photovoltaic receiver converts incident sunlight into electrical energy. At least one optical element concentrates incident light onto the photovoltaic receiver. The heat-dissipating element is located at least partially within a volume of the module which is swept out by the module as it articulates, intersected with the volume of the concentrator in which incident light rays are present in the optical system.

According to yet another aspect of the present invention, a method is provided of providing a photovoltaic power system including the step of configuring a support structure of a photovoltaic power system to have a form factor that is compatible with a pre-existing, non-concentrating, flat solar panel. The photovoltaic power system includes a support structure and a plurality of photovoltaic concentrator modules supported by the support structure in a manner such that at least one module is moveable with respect to the support structure.

According to yet another aspect of the present invention, a method of installing a photovoltaic power system is provided that includes the steps of 1) providing mounting hardware for a flat solar panel, 2) providing a photovoltaic power system that has a form factor compatible with the mounting hardware for a flat solar panel, and 3) installing the photovoltaic power system using the mounting hardware for a flat solar panel. The photovoltaic power system includes 1) a stationary, rigid support structure, and 2) a plurality of photovoltaic concentrator modules movably supported upon the stationary, rigid support structure.

According to yet another aspect of the present invention, a photovoltaic concentrator module assembly includes a frame, an array of photovoltaic concentrator modules, a tracker system, and a source of power. The array of photovoltaic concentrator modules are mounted to the frame in a manner such that the modules articulate relative to the frame. Each module includes at least one photovoltaic receiver that converts incident sunlight into electrical energy and at least one optical element that concentrates incident light to the photovoltaic receiver. The tracker system is operatively coupled to the assembly and moves at least one of the modules based on a direction of incoming sunlight. The source of power is operatively coupled to the tracker system.

DETAILED DESCRIPTION OF PRESENTLY PREFERRED EMBODIMENTS

Figure 1A:
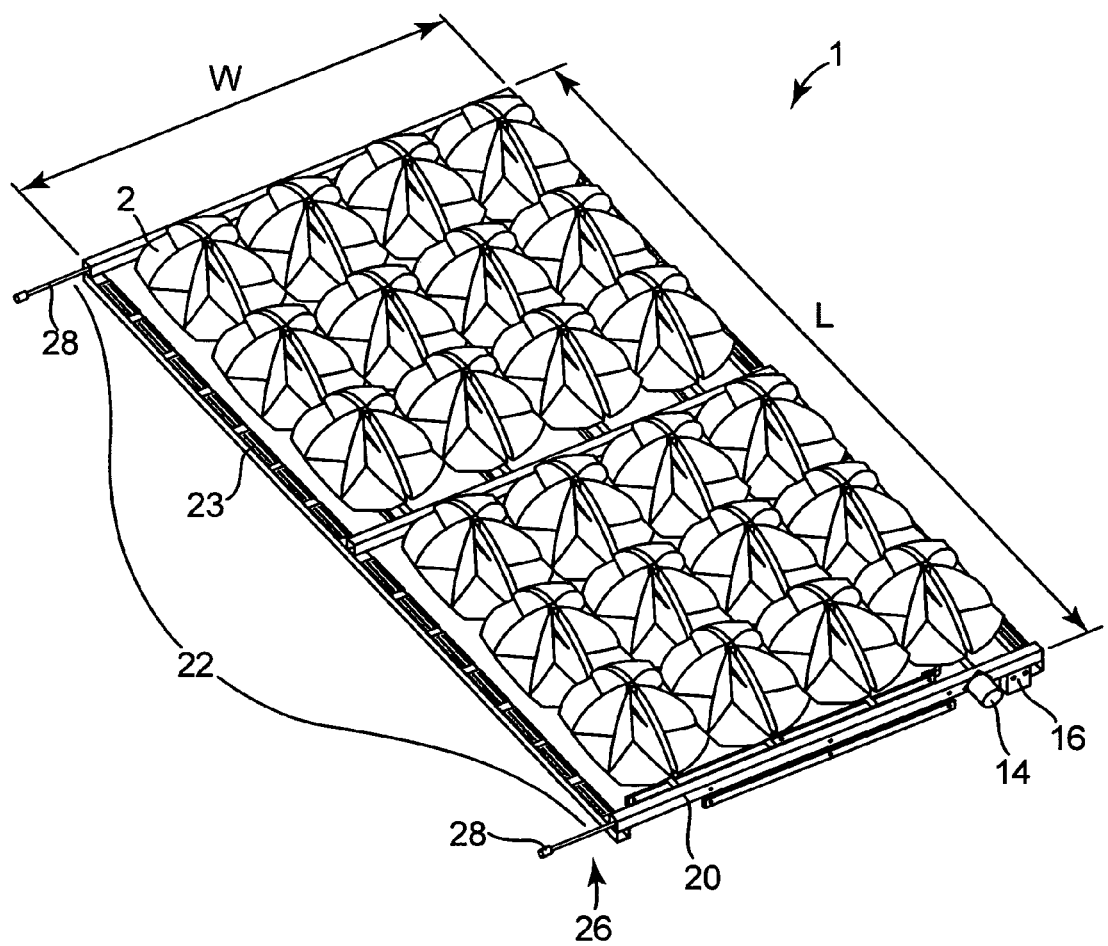
FIG. 1A shows a perspective view from above of an embodiment of a photovoltaic power system according to the present invention.

In the embodiments described below, the same reference characters are used to describe features that are the same among the embodiments.

A first embodiment of a photovoltaic power system according to the present invention is shown in FIGS. 1A-2C. Photovoltaic power system 1 includes a plurality of moveable solar concentrator modules 2. Each solar concentrator module 2 is about 9.5 inches in diameter. As shown, solar concentrator module 2 includes reflector 4 as an optical element to concentrate sunlight to high intensity so that it can be used to create electricity. Reflector 4 directs the concentrated sunlight to receiver 6, which includes one or more solar cells, which can be any kind of photovoltaic electricity generator that converts light into electricity.

In this embodiment, the concentrated sunlight is used for creating electricity, but the sunlight could alternatively be used for any purpose, e.g., heating water or cooking food. The present concentrating photovoltaic electricity generator uses optics to concentrate light onto the solar cell(s), producing a proportionately larger amount of electricity than the cell(s) would produce under normal illumination.

In addition to the solar concentrator modules 2, the embodiment includes linkage 12, motors 14, control unit 16, frame 20, self-power panel 22, and circuit 26.

A solar concentrator module is any device which uses some optical element (e.g. reflector 4), such as a lens, reflector, or solar trap, to concentrate sunlight onto a target, where it may perform some useful function.

Figure 2A:
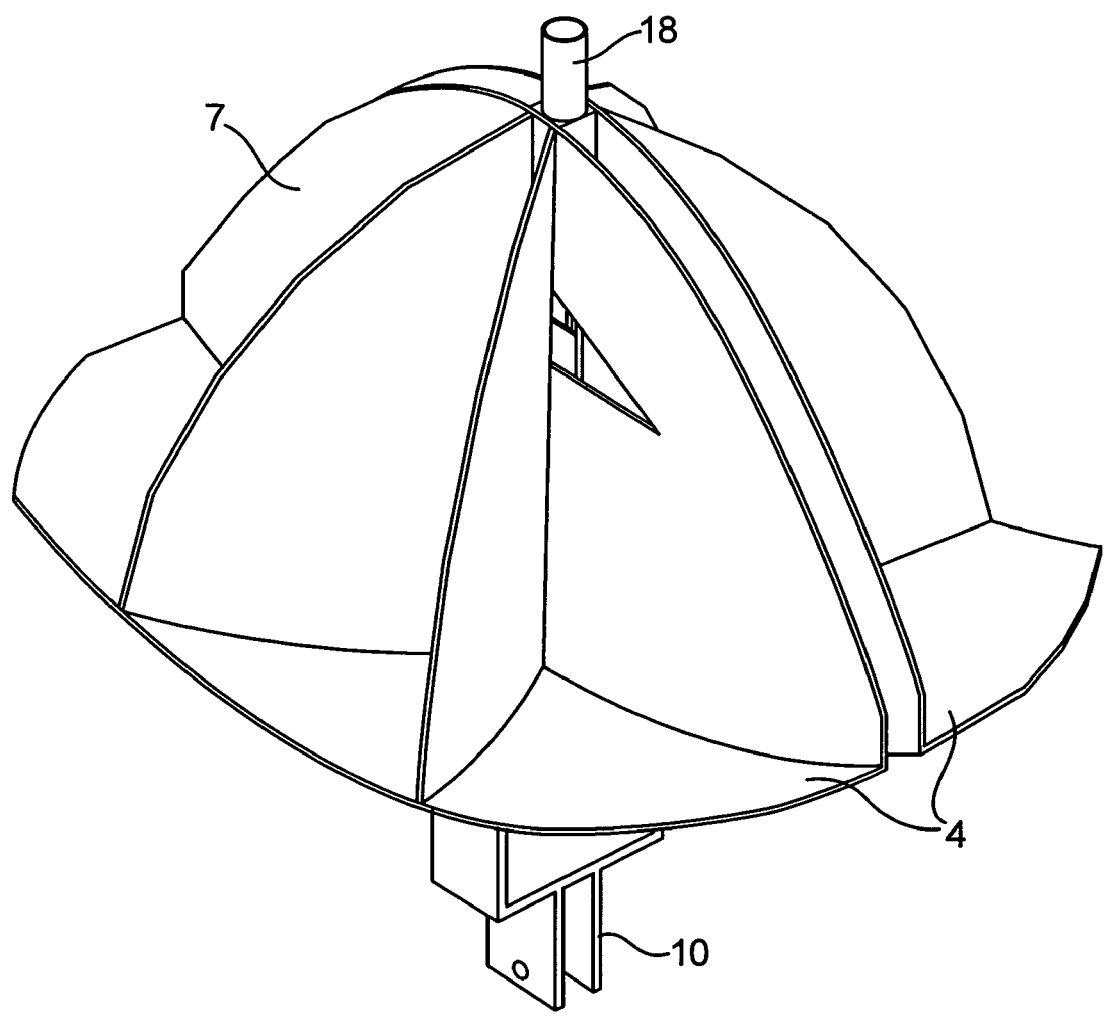
FIG. 2A shows a perspective view from the side of a concentrator module illustrated in the photovoltaic power system in FIG. 1A.
Figure 2B:
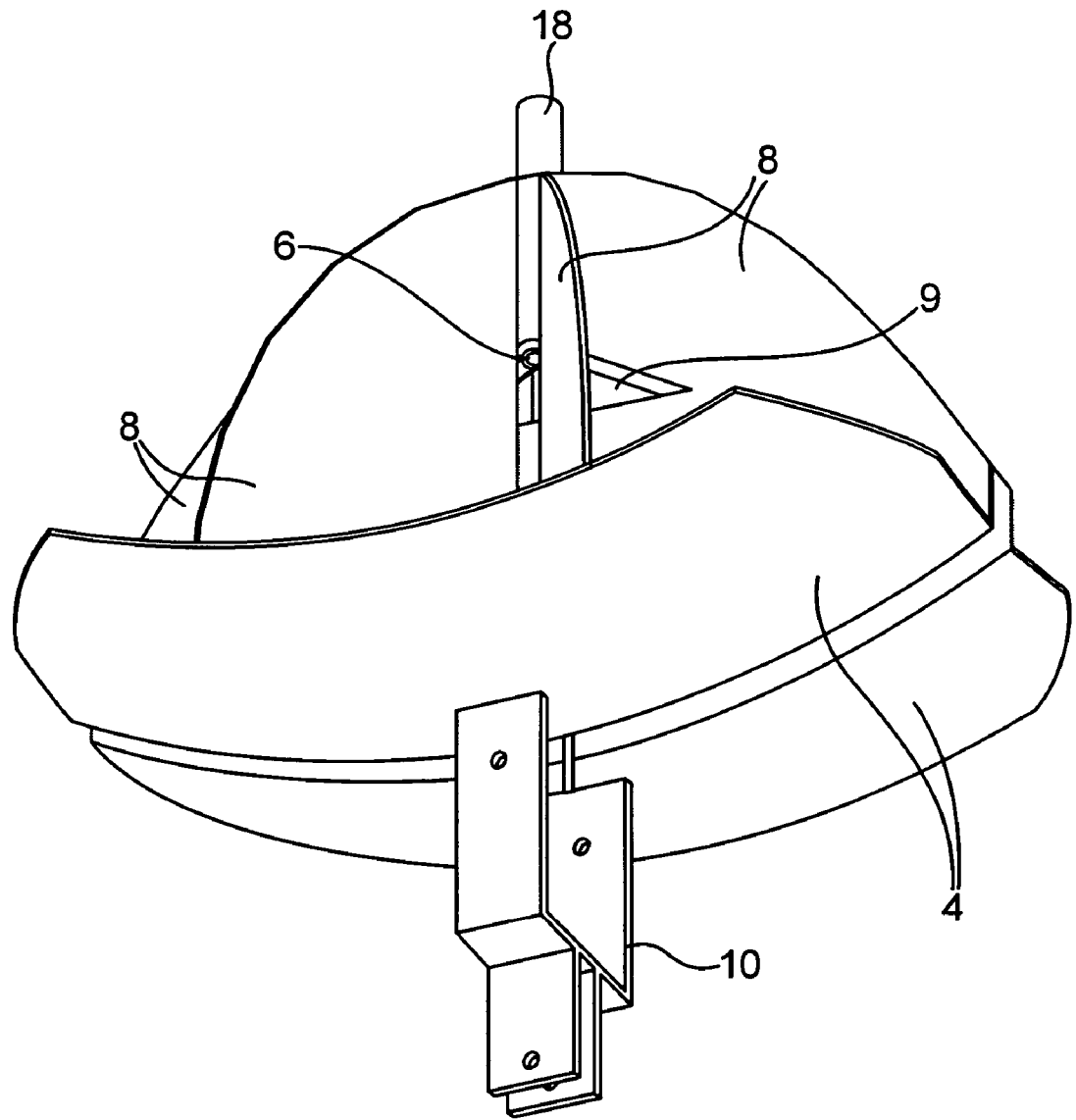
FIG. 2B shows a perspective view from below of the concentrator module illustrated in FIG. 2A.

In addition to reflector 4, each solar concentrator module 2 also includes receiver 6, heat sink 7, and yoke mechanism 10. FIG. 2A shows a perspective view of an individual solar concentrator module 2 used in system 1, while FIG. 2B shows a perspective view from below the individual solar concentrator module 2. The solar concentrator module 2 shown in FIGS. 2A and 2B could include an optional tracking sensor unit 18, which informs the electronic control unit 16 of the position of the sun; preferably this is present on only some of the concentrators 2, for example, on one, two, three, or four of the solar concentrator modules 2.

Figure 2C:
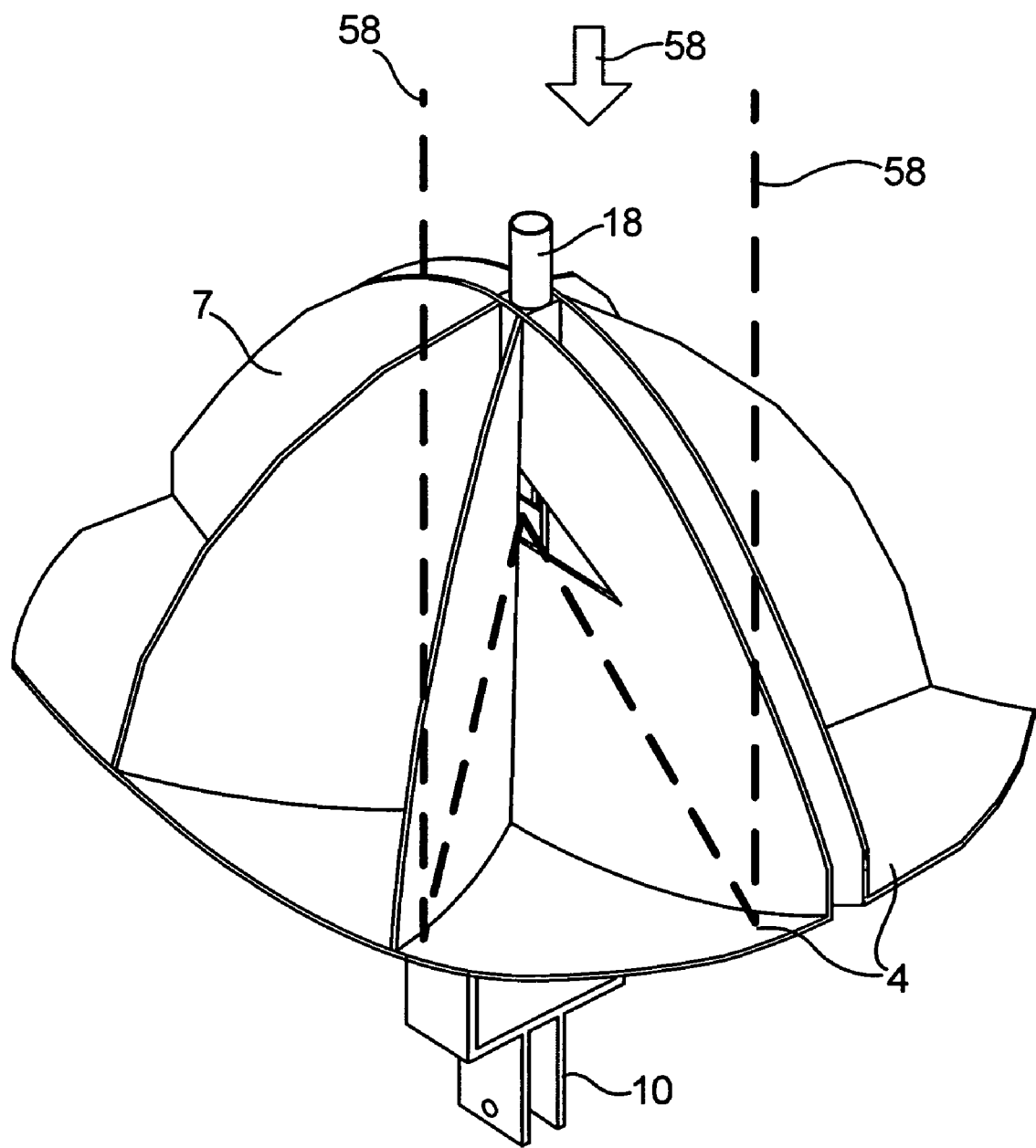
FIG. 2C shows the orientation of the heat sink fins of the concentrator module illustrated in FIG. 2A relative to incoming sunlight.

Reflector 4 of an individual solar concentrator module 2 is shown as a rounded rectangle, and the concentrator modules of the embodiment are arranged in a rectangular grid. In alternative embodiments, the concentrator reflector can be any shape, and the concentrator modules can be arranged into any layout, that is suitable, including but not limited to diamond-shaped, hexagonal, square, round, or elliptical (see FIGS. 7-9). As shown in FIG. 2C, incoming sunlight 58 is reflected off of reflector 4 and directed to receiver 6.

The invention described can make use of any sort of photovoltaic device, including but not limited to traditional silicon solar cells, so-called thermal photovoltaic cells, high tech multi-junction cells, or even other technologies such as combinations of several kinds of solar cells. The preferred embodiment shown in FIGS. 1A-2C envisions using triple-junction cells commercially available from Spectrolab, Inc., Sylmar, Calif., or the like in the receivers 6 in order to achieve a power output in excess of 200 watts peak, which is commensurate with the output of flat photovoltaic panels of the same size on the market today.

Due to the intensity of the solar radiation that is concentrated on the solar cell, the cell's temperature desirably is managed by a cooling system. While the preferred embodiment uses a passive heat sink 7 to cool the solar cell and receiver, the invention is not specific as to the sort of cooling system that is used and can make use of forced air or liquid cooling as well.

Heat sink 7 has features including a plurality of fins 8 for passive heat dissipation, a flat surface for mounting the receiver 6, and a cutout 9 to allow light to reach the receiver 6. The complete heat sink 7, as can be seen in FIGS. 1A and 2A-2C, in the preferred embodiment, is designed such that the fins 8 are placed parallel to the optical axis of the module. In this way, only the edges, e.g., the thickness of the heat sink fins 8, actually block the sunlight. This allows a very large fin area to be achieved with little reduction in the amount of collected sunlight. Advantageously, at least portions, and more preferably at least substantially all of the fins 8 are positioned within the volume of the concentrator module under concentrated illumination, or as can be seen by reference to, e.g., FIG. 2C as that volume in which light rays are converging towards a focus.

As shown with respect to the illustrated module, this volume generally at least includes the approximately cylindrical region that is both above the reflector 4 and below the receiver 6, as well as a portion of the region above the receiver. In the preferred embodiment, as can be seen in FIG. 2C, the fins of the heat sink 7 are aligned parallel with the adjacent rays of sunlight 58 and placed within the volume of the concentrator module, or "optical volume", thus allowing large fin area without increasing the wind profile and total volume of the module overall. In the preferred embodiment, this is accomplished by placing the fins vertically and orienting them radially about the receiver, so that generally the only light that is blocked is that impinging on the thin edges of the fins, representing a tiny fraction of the overall incident light.

As used herein, the term "optical volume" is defined by reference to FIG. 2C as the volume which is swept out by the module as it articulates, intersected with the volume of the concentrator in which incident light rays are present in the optical system.

In the preferred embodiment, the central pair of fins is slightly canted from an exactly radial direction to allow mechanical clearance for the linkage 12. As such, they could potentially block a small amount of sunlight in the converging beam; for this reason, the cutout 9 is specially shaped so as to avoid undue blocking of sunlight from the parts of the reflector near these central fins.

As shown in FIGS. 1B-2C, each concentrator module 2 in system 1 includes a yoke mechanism 10, which holds and articulates the concentrator module 2. System 1 includes a simple mechanical linkage 12 which drives a set of yokes 10, but the invention is not specific as to the type of mechanisms used. Any drivetrain, linkage, and mechanism combination can be used, including but not limited to direct drive, gears, lead screws, cable drive, universal joints, gimbals, and flexures. In the preferred embodiment, the modules are coupled together with a linkage so that they all move in synchrony, yet each module articulates individually in place, rather than articulating en masse as a fixed group. Linkage 12 includes a plurality of azimuth rods 30 and a plurality of elevation rods 36. The azimuth rods 30 are connected to an azimuth tie rod 32, which is supported by a plurality of azimuth tie links 34. The elevation rods 36 are connected to an elevation tie rod 38.

Representative embodiments desirably incorporate individual concentrators that are articulated in synchrony to point at and track the sun in order to generate power. Representative embodiments may be used with any number of tracking approaches, including but not limited to open-loop (model-based) pointing, closed-loop pointing based on a local sensor, closed-loop pointing based on optimizing the power output of the panel, or closed-loop pointing based on a sensor shared by several panels. Control of the embodiment can be accomplished in a number of ways, including passive control (such as refrigerant-based trackers), active control using one electronic control unit per panel, or active control using a single control unit that controls a number of panels.

Similarly, any number of actuation methods can be used, including but not limited to motors, solenoids, or nitinol wires. There can be individual actuators for each concentrator (for example, two motors for each), or the panel can make use of a linkage, cable drive, or other mechanism to allow a single actuator set to move two or more of, or even all of, the concentrators together. Similarly, the technique for pivoting is not constrained, with bearings, bushings, flexures, or other approaches all of which are suitable for use in representative embodiments.

In the embodiment in FIGS. 1A-2C, a single pair of motors 14 drives/actuates a linkage 12 which moves all the concentrators 2 in concert. Electronic control unit 16 drives the motors 14. The preferred embodiment of FIGS. 1A-2C uses the per-panel active electronics control approach as embodied in the electronic control unit 16.

Similar to system 1, representative embodiments aggregate a multiplicity of concentrating elements into a single device, and preferably a device that is approximately the size of a traditional solar panel. Traditional panels are often 2.5 to 4 feet wide and 4.5 to 6 feet long. However, the size of the device is not specific and can be configured to any size desired by the customer or end user within realistic limits. Such limits are generally from as small as 6 inches by 6 inches to as large as 20 feet by 20 feet or even larger, with the upper bound really being dependent only on what the customer can easily manipulate and install at a target site.

Figure 1B:
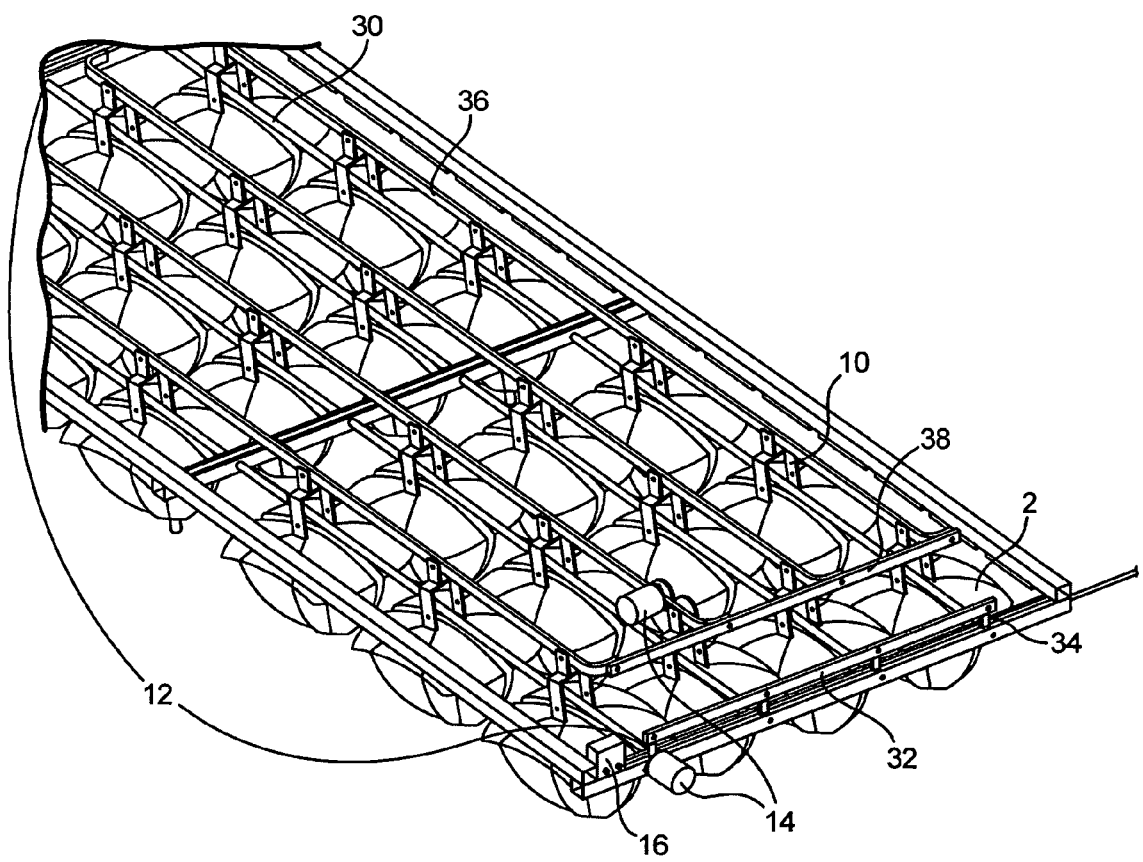
FIG. 1B shows a perspective view from below of the photovoltaic power system in FIG. 1A.

The preferred embodiment, for instance, is approximately the size of a traditional solar panel and is shown including frame 20 in FIGS. 1A and 1B. Frame 20 has a width W of 48 inches and a length L of 72 inches, and may allow system 1 to generate in excess of 200 watts peak of electricity.

Frame (or base, preferably planar and rigid) 20 holds the electronic control unit 16, the motors 14, the linkage 12, the concentrator modules 2, provides a mounting location for a self-power panel 22, and provides for mounting of the embodiment using standard solar panel mounting hardware. As shown in FIGS. 1A and 1B, for purposes of illustration, system 1 includes 24 individual photovoltaic concentrators 2. A greater or lesser number of concentrators 2 than this may be used, if desired. Larger or smaller concentrators may be used as well. Note that the individual concentrator modules 2 are preferably spaced apart rather than being closely abutting. This spacing facilitates coupled movement of the individual concentrators when, for instance, tracking the sun, and it also facilitates a more cost-efficient solar panel, since the units may then operate through a larger part of the day and year without the individual concentrators substantially shading one another.

The approach to wiring and electrically connecting the various components will be well known to those with skill in the photovoltaic solar concentration field. Any of a variety of approaches may be used. The outputs of the individual concentrators may be wired in any desired fashion, such as in series or in parallel, or in some series-parallel combination. The unit as a whole may have a single power output, or it may have more than one power output. By wiring the individual concentrators in different ways, an embodiment can achieve any of a wide range of output voltages and currents. It can be configured to approximately match the output voltage of a traditional flat panel, or it can be configured to output higher (or even lower) voltage, with the concomitant change in output current, in order to achieve other benefits at the system level, such as reduced losses in the system wiring. By way of example, system 1 includes a circuit 26 for delivering the generated power from the concentrator modules 2. Circuit 26 includes wiring (not visible, running inside linkage 12) and output leads 28. The wiring links the concentrator modules 2 together into a circuit 26. The pair of power output leads 28 delivers the generated power from the concentrator modules 2. The concentrating modules 2 are wired together in series using the wiring to produce an output voltage of approximately 65 volts, which voltage is supplied at the power output leads 28.

One skilled in the art will be aware that bypass diodes are generally desirable to protect the solar cells in the receivers 6 from harmful voltages. Depending on details of the solar cells used, an embodiment may include one bypass diode per concentrator module, or several concentrator modules may share diodes, or one bypass diode may be used for the entire unit. The bypass diodes may be part of the unit or they may be external to the unit. The preferred embodiment has one bypass diode per concentrator module.

Since many embodiments of the invention will make use of electrically-powered components (e.g., control unit 16 and/or motors 14), it is desirable to provide power to operate those components, even if the panel has not yet acquired and tracked the sun. The invention accommodates any method for powering the electronics, including but not limited to: making use of the tiny amount of power the unit generates even when not pointed at the sun; making use of power supplied by an external power supply that is installed as part of the overall solar system installation; using a traditional solar panel to provide electronics power for a number of the concentrator panels; building traditional solar cells or miniature panels into the concentrating panel itself (for example, on the upper surfaces of the frame) to provide power to operate the electronics. The embodiment of FIGS. 1A-2C uses the last of these approaches. The electronic control unit 16 requires electrical power to operate. Any suitable power supply may be used. For purposes of illustration, this power is supplied in the illustrated embodiment by the solar cells 23 of the self-power panel 22, which is affixed to the frame 20 of the unit.

Representative embodiments can be mounted in many different ways. For example, the embodiment shown in FIGS. 1A-2C can be mounted in its target installation using whatever technique the installer traditionally uses, whether a non-penetrating flat rooftop mount like the PowerLight® PowerGuard® system commercially available from PowerLight Corporation, Berkeley, Calif., an anchored mount for a residential rooftop, a latitude-tilt mount, or even a ground mount or mounting on a single-axis tracker. The installer and end user can choose whatever mounting approach makes the most sense for them.

Using the system 1 to provide solar-generated power will now be described in further detail. In order for the embodiment to produce a desired rated power output, the individual concentrator modules 2 are pointed at the sun. This may be accomplished as follows, according to one approach. The tracking sensor units 18 sense the position of the sun and provide a pointing error signal to the electronic control unit 16. The electronic control unit 16 then computes the pointing error and provides drive current as needed to the motors 14, in order to move the linkage 12. The linkage 12 moves the yoke mechanisms 10, which cause the concentrator modules 2 to point at the sun, preferably to an accuracy of a small fraction of degree.

Software within the electronic control unit 16 helps to ensure proper operation during events such as sunrise and sunset, cloud cover, and lack of sufficient power for operation. The software also desirably performs open-loop prediction of sun position based on previously received data, and so on.

Several alternative embodiments of a photovoltaic power system according to the present invention will now be described.

Figure 3:
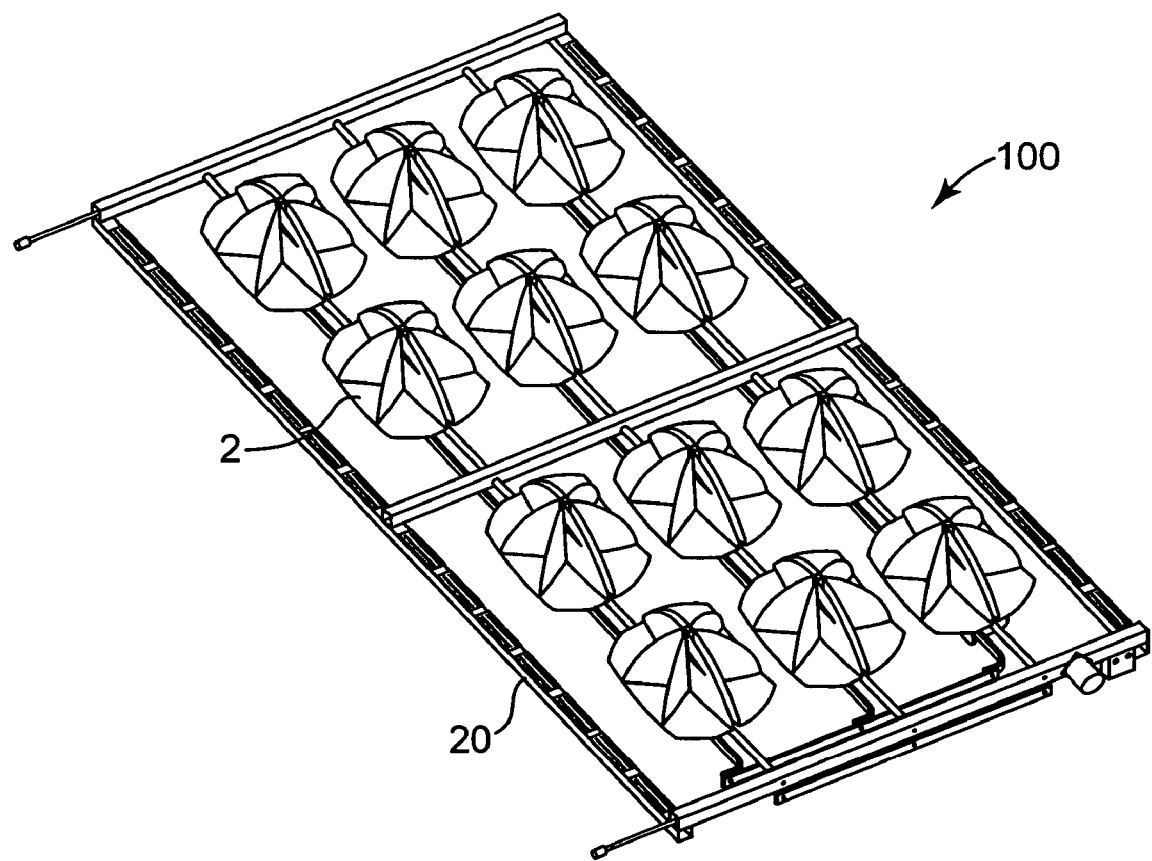
FIG. 3 shows a perspective view of an alternative embodiment of a photovoltaic power system according to the present invention.

FIG. 3 shows a perspective view of an alternative embodiment of a photovoltaic power system 100 according to the present invention. The alternative in system 100 is to put some amount of space between the individual concentrator modules 2, rather than packing them tightly together. When the modules are spaced further apart, the unit as a whole produces less power, but each individual module can be more cost-effective, since it can operate through a larger portion of the day and of the year without being shaded by its neighboring modules. This makes more effective use of the receivers 6 and concentrator modules 2, but makes less effective use of the frame 20, motors 14, linkage 12, electronic control unit 16, and so on.

The optimal space between the modules thus depends on factors such as the expected annual solar radiation, expected electric utility rates, relative cost of the frame, linkage, receivers, and modules, and so on.

Figure 4:
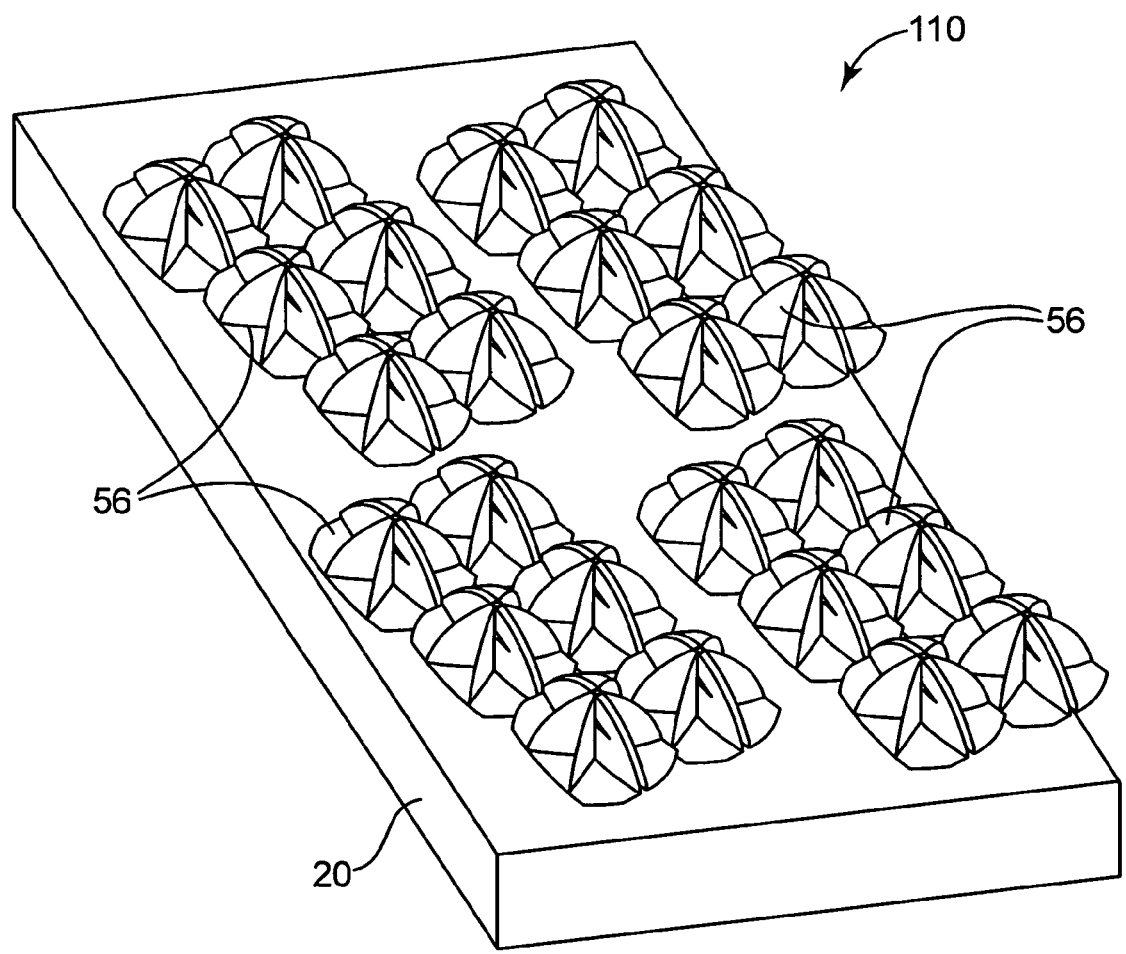
FIG. 4 shows a perspective view of an alternative embodiment of a photovoltaic power system according to the present invention.

FIG. 4 shows a perspective view of an alternative embodiment of a photovoltaic power system 110 according to the present invention. System 110 causes the modules 2 to move together in small groups 56. System 110 has four groups 56 of six modules 2. While the outer frame 20 of the unit is still fixed, and the overall system 110 is still planar, the individual modules 2 in each group 56 move in fixed relation to their neighboring modules in the same group. However, the module groups 56 still move individually, with the module groups being coupled together with a reduced-part-count version of the linkage 12 so that they all move in the same way.

Figure 5A:
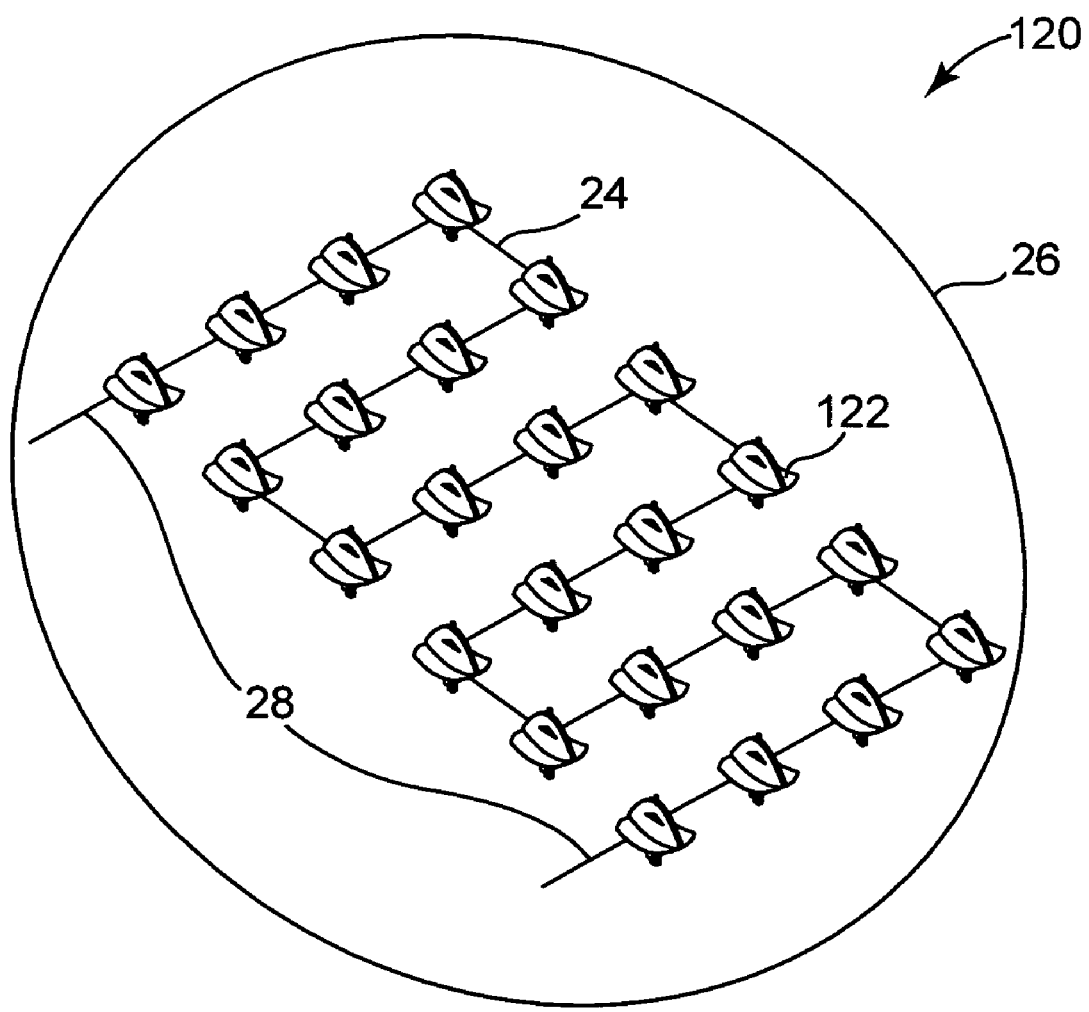
FIG. 5A shows a schematic diagram of a power circuit for an alternative embodiment of a photovoltaic power system according to the present invention.

FIG. 5A shows a schematic diagram of a power circuit for an alternative embodiment of a photovoltaic power system 120 (support structure not shown to make wiring 24 visible) according to the present invention. The power circuit 26 of the preferred embodiment is a series connection, as shown in FIG. 5A, preferably including the wiring 24 and the power output leads 28.

Figure 5B:
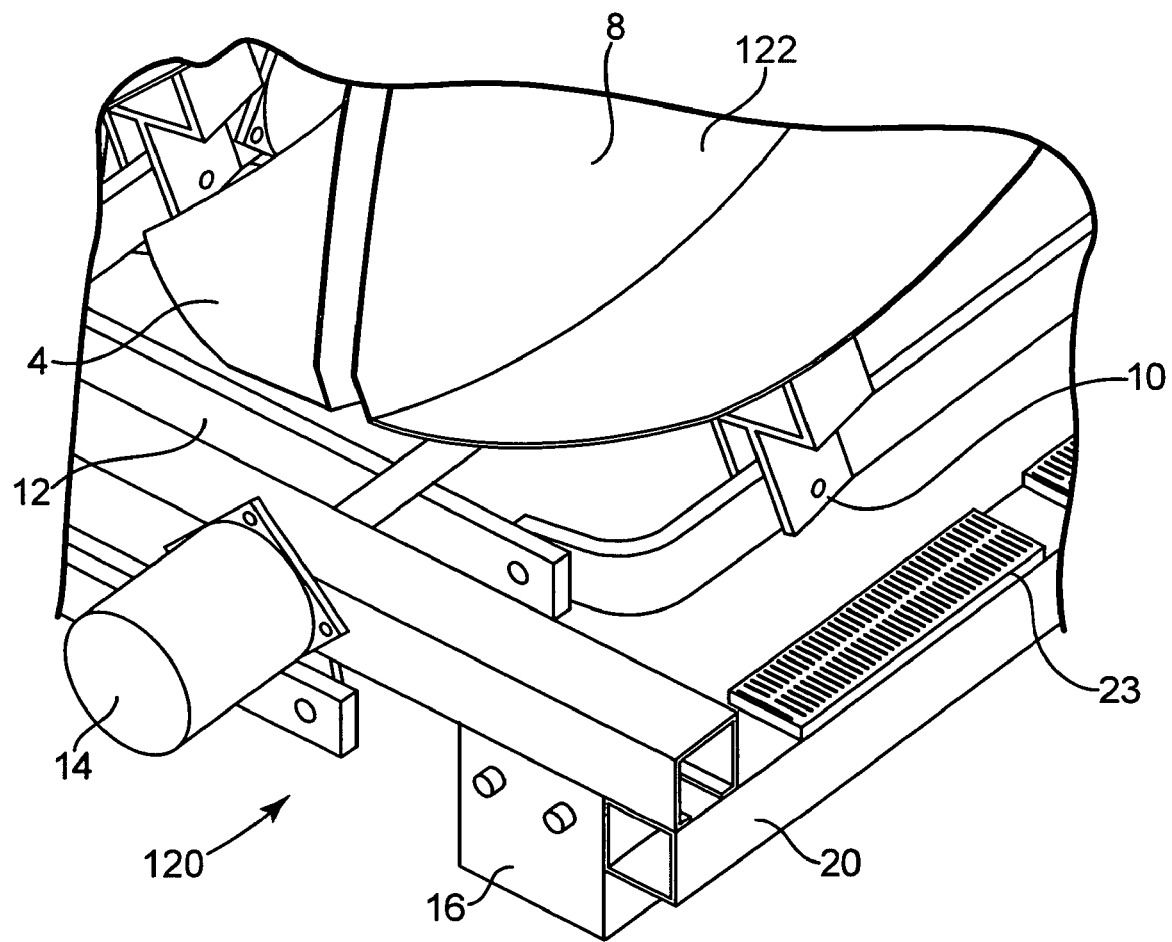
FIG. 5B shows an enlarged perspective view of a portion of the photovoltaic power system referred to in FIG. 5A that includes an actuating motor and control unit.

FIG. 5B shows an enlarged perspective view of a portion of photovoltaic power system 120 with associated support structure shown, including an actuating motor 14 and control unit 16. Electronic control unit 16 drives the motors 14. The electronic control unit 16 requires electrical power to operate. Any suitable power supply may be used. For purposes of illustration, this power is supplied in the illustrated embodiment by the solar cells 23 of the self-power panel 22, which is affixed to the frame 20 of the unit. A close-up of the one of the solar cells 23 is shown in FIG. 5B.

Figure 6A:
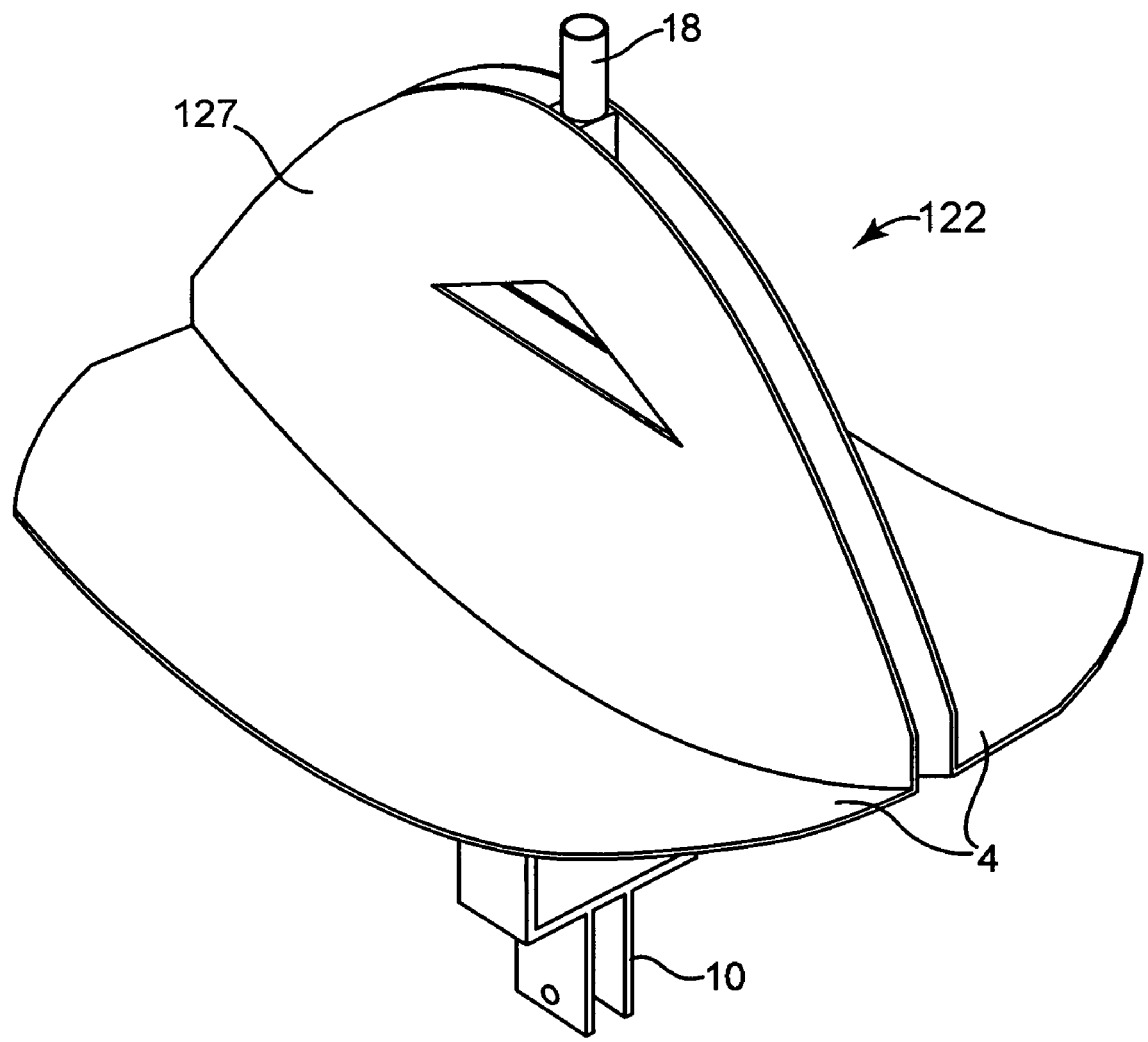
FIG. 6A shows a perspective view from the side of a concentrator module illustrated in FIG. 5A.
Figure 6B:
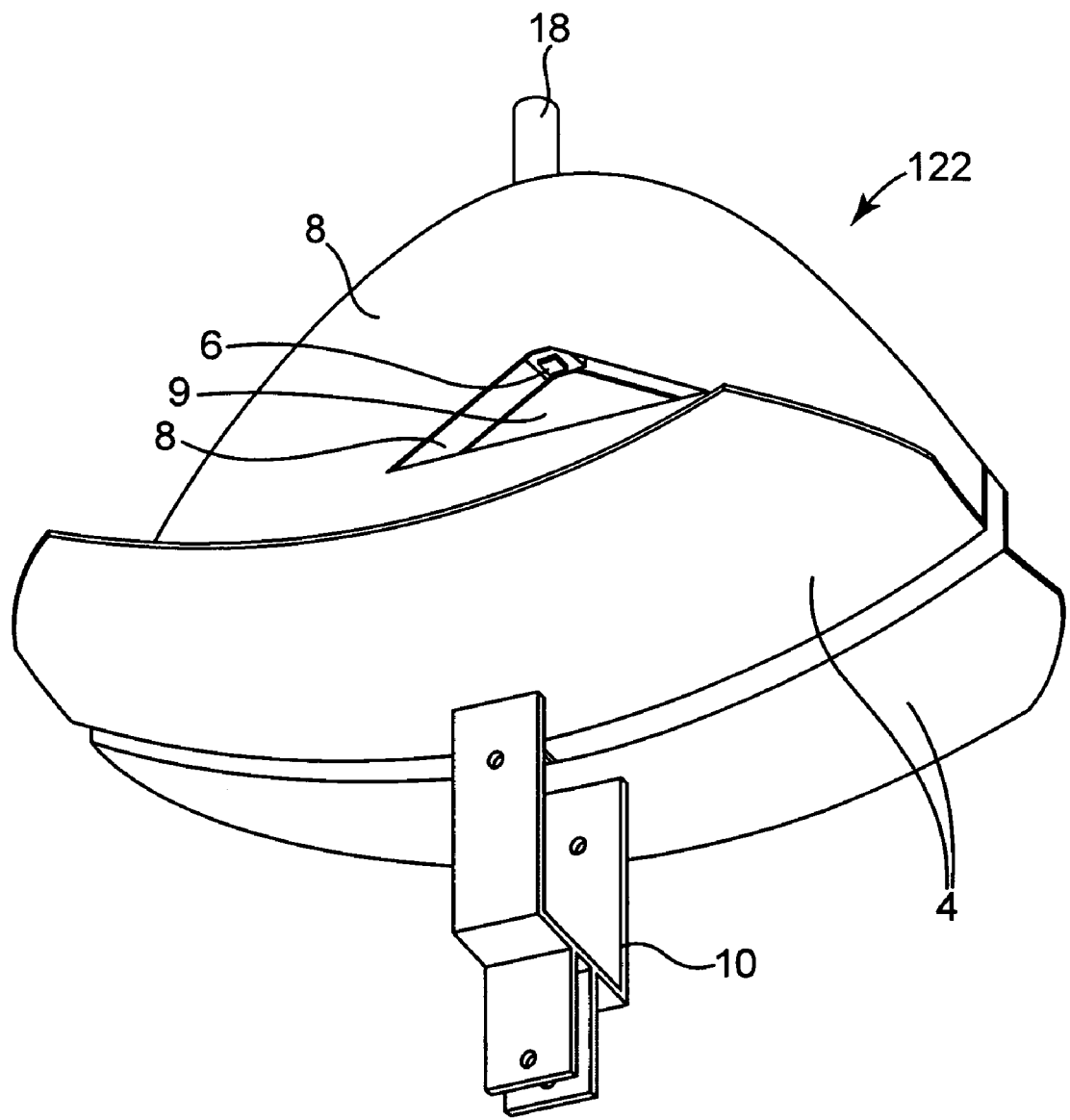
FIG. 6B shows a perspective view from below of the concentrator module illustrated in FIG. 6A.

FIG. 6A shows a perspective view from the side of a concentrator module 122 illustrated in FIG. 5A. FIG. 6B shows a perspective view from below of the concentrator module 122 illustrated in FIG. 6A. Module 122 has a simpler heat sink 127 that has only a single pair of cooling fins 8. As shown, the heat sink 127 includes a pair of semicircular fins 8 and a gap 9, which allows the light from the reflector 4 to reach the solar cell in the receiver 6. Heat sink 127 is the one that is illustrated in subsequent figures since, due to the simpler heat sink 127, other features of the invention are more readily visible.

Figure 7:
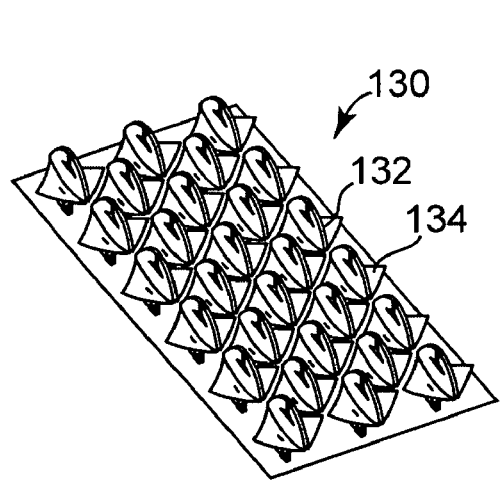
FIG. 7 shows a perspective view of an alternative embodiment of a photovoltaic power system according to the present invention.

FIG. 7 shows a perspective view of an alternative embodiment of a photovoltaic power system 130 according to the present invention. System 130 includes modules 132. Each module 132 has a reflector 134 that is diamond-shaped.

Figure 8:
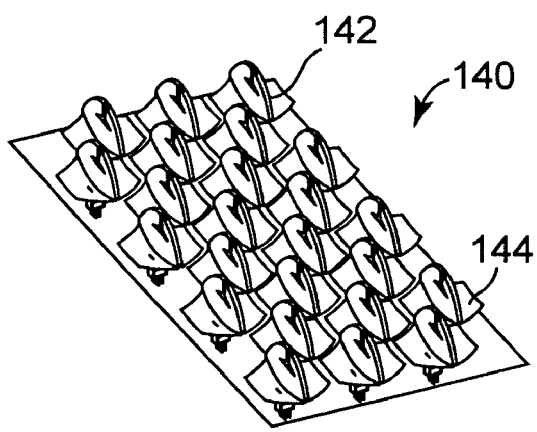
FIG. 8 shows a perspective view of an alternative embodiment of a photovoltaic power system according to the present invention.

FIG. 8 shows a perspective view of an alternative embodiment of a photovoltaic power system 140 according to the present invention. System 140 includes modules 142. Each module 142 has a reflector 144 that is hexagonal in shape.

Figure 9:
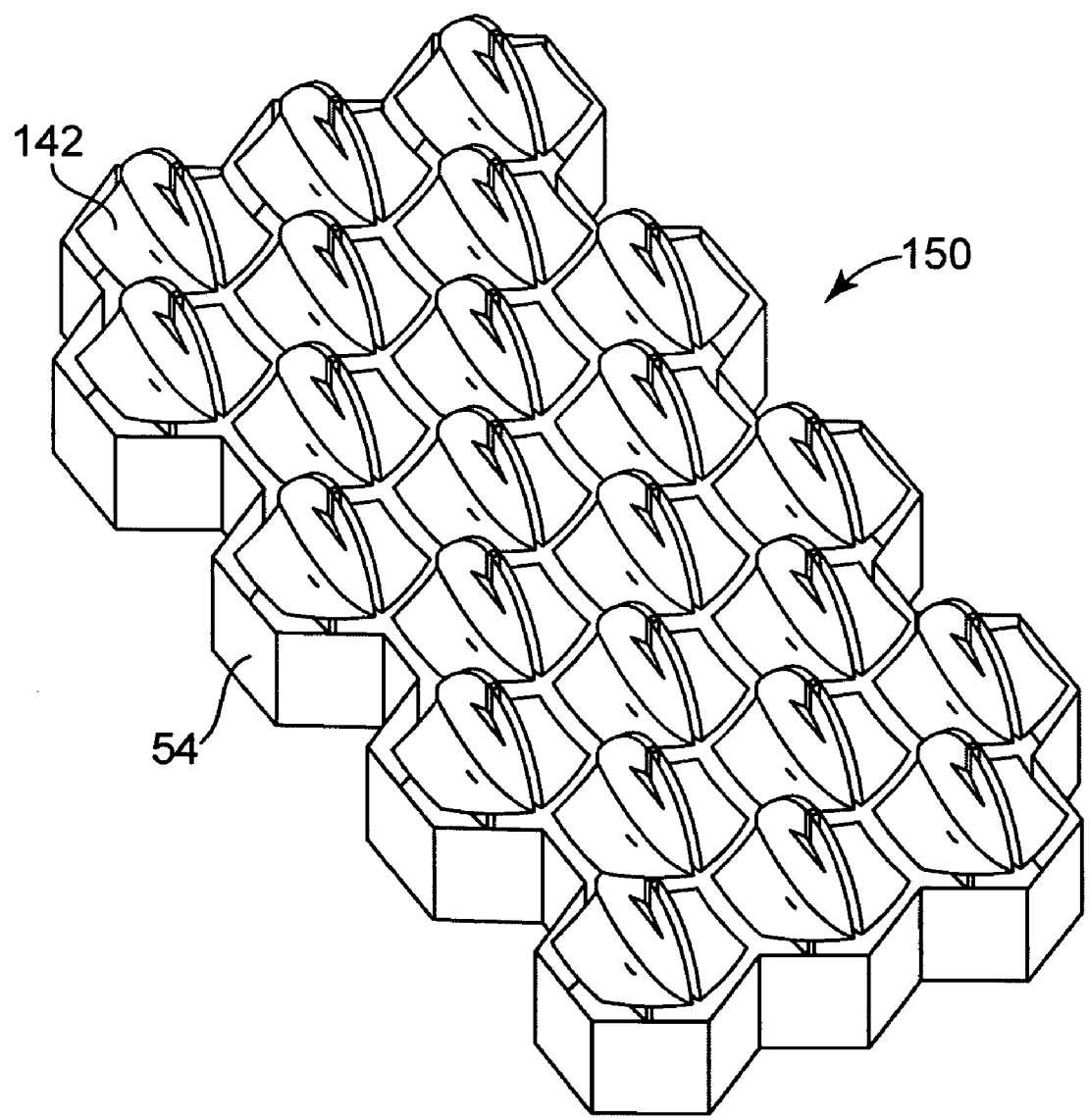
FIG. 9 shows a perspective view of an alternative embodiment of a photovoltaic power system according to the present invention.

FIG. 9 shows a perspective view of an alternative embodiment of a photovoltaic power system 150 according to the present invention. System 150 includes modules 142 and shows another potential feature of the invention, which is the option for "corrugated" sidewalls 54, allowing denser packing of the units when installed, allowing maximum power production density in a given space. As an alternative, the invention can also accommodate corrugated sidewalls 54 on just one pair of walls, such as only on the sides, while leaving the ends straight for a clean edge on the entire row of panels and for ease of installation. The possibility of using a corrugated frame to improve installed power density is a claim of this invention.

Figure 10:
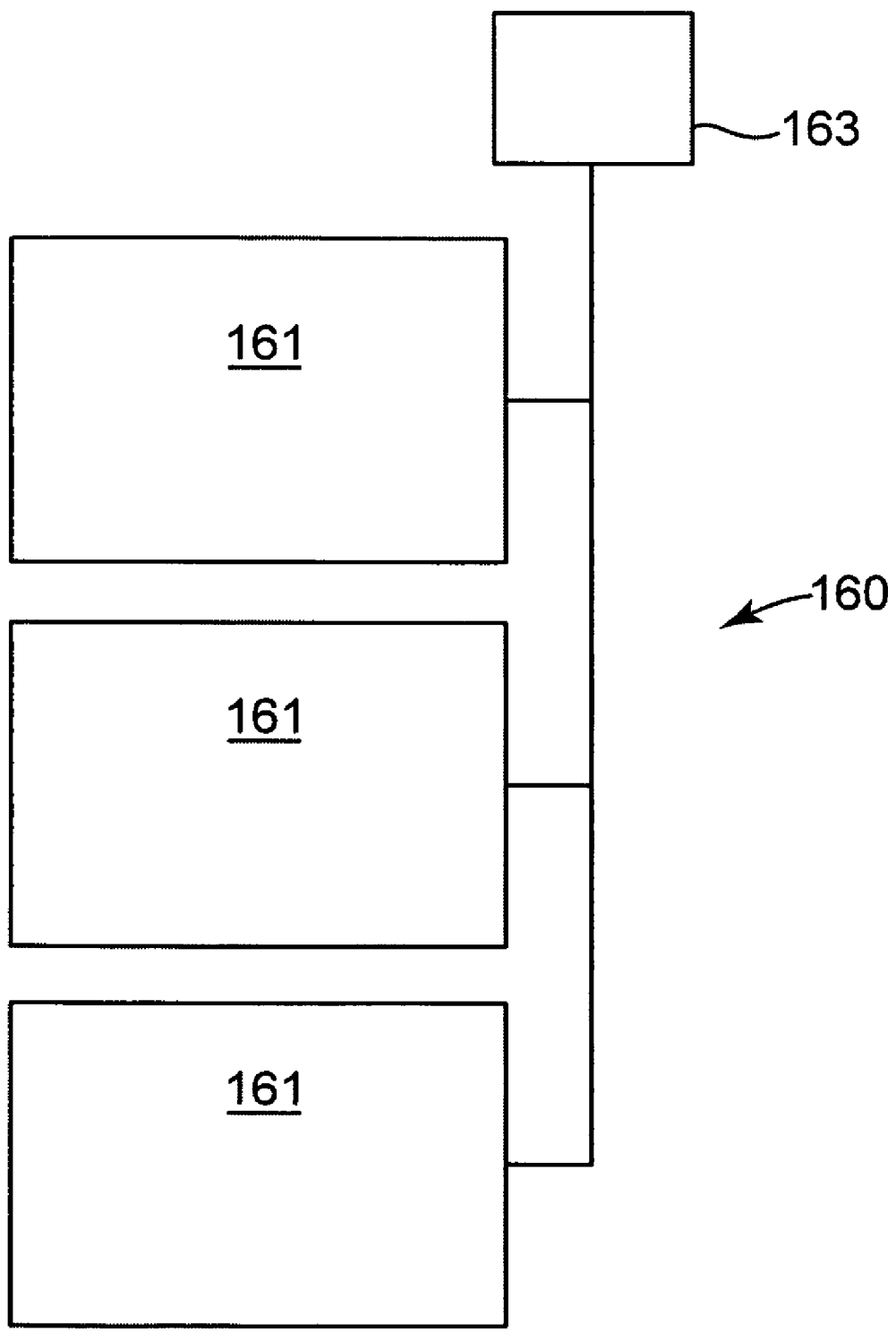
FIG. 10 shows a diagrammatic view of an alternative shared control architecture.

FIG. 10 shows a diagrammatic view of an alternative shared-control architecture 160. Architecture 160 involves three panels 161 that are connected to shared-control module 163.

Figure 13:
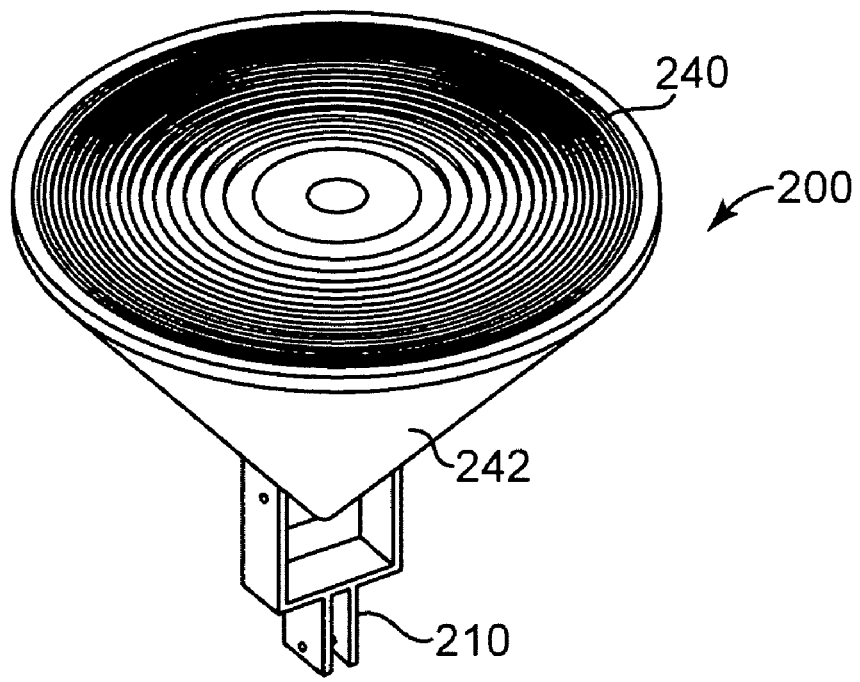
FIG. 13 shows a first alternative concentrating element.
Figure 14:
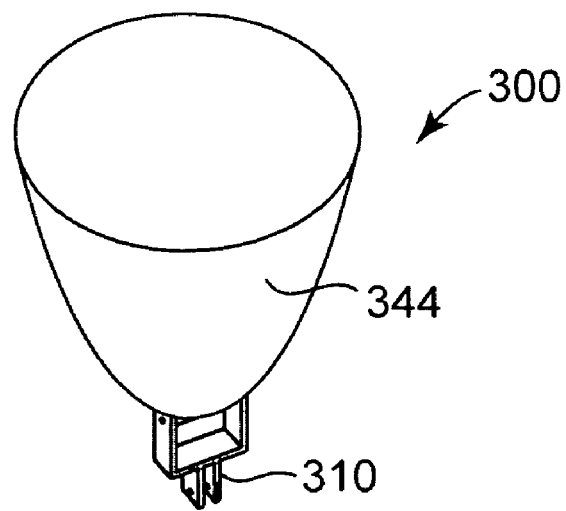
FIG. 14 shows a second alternative concentrating element.
Figure 15:
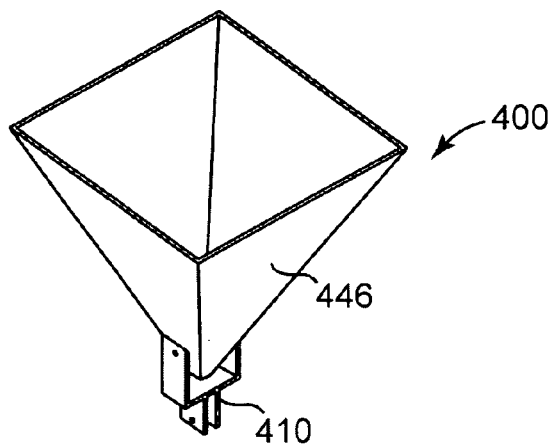
FIG. 15 shows a third alternative concentrating element.
Figures 16A, 16B:
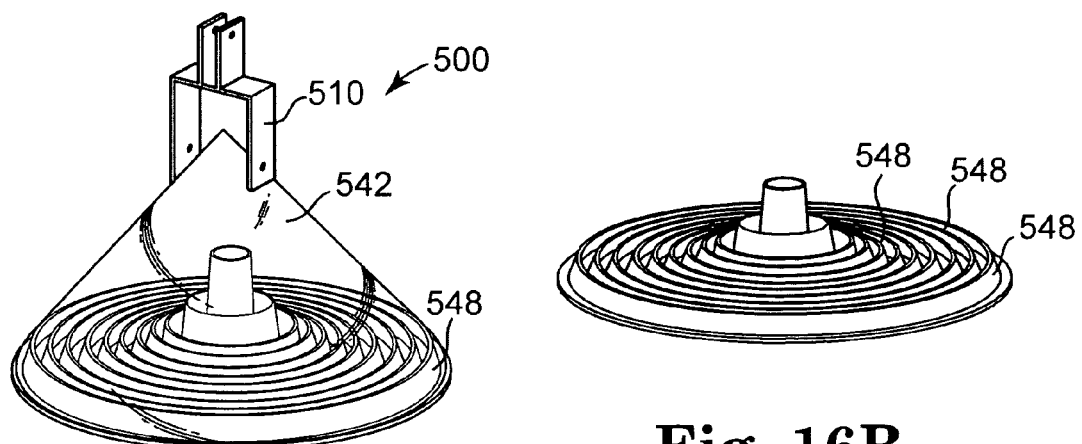
FIG. 16A shows a fourth alternative concentrating element.
FIG. 16B shows the reflective rings portion of the concentrating element in FIG. 16A with the remaining portions removed.

The invention described, as an alternative, can make use of any sort of concentrating element, including but not limited to traditional lenses, Fresnel lenses, parabolic or other reflectors, and even other patented technologies such as a reflective ring concentrator, compound parabolic concentrator, or various solar traps (e.g., pyramidal reflector). Examples of alternative concentrating elements are shown in FIGS. 13-16B. FIG. 13 shows a Fresnel lens concentrator 200, including a Fresnel lens 240, a body 242, and a yoke 210. FIG. 14 shows a compound parabolic concentrator 300, including a compound parabolic reflector 344 and a yoke 310. FIG. 15 shows a solar trap 400, including a pyramidal reflector 446 and a yoke 410. FIG. 16A shows a reflective ring concentrator 500, including a plurality of steeply tilted reflective rings 548, a body 542, and a yoke 510. Concentrator 500 is shown upside down so that the rings 548 can be more easily seen. FIG. 16B shows the reflective rings 548 portion of concentrator 500 with the remaining portions removed.

Several optional features will now be described.

Figure 11:
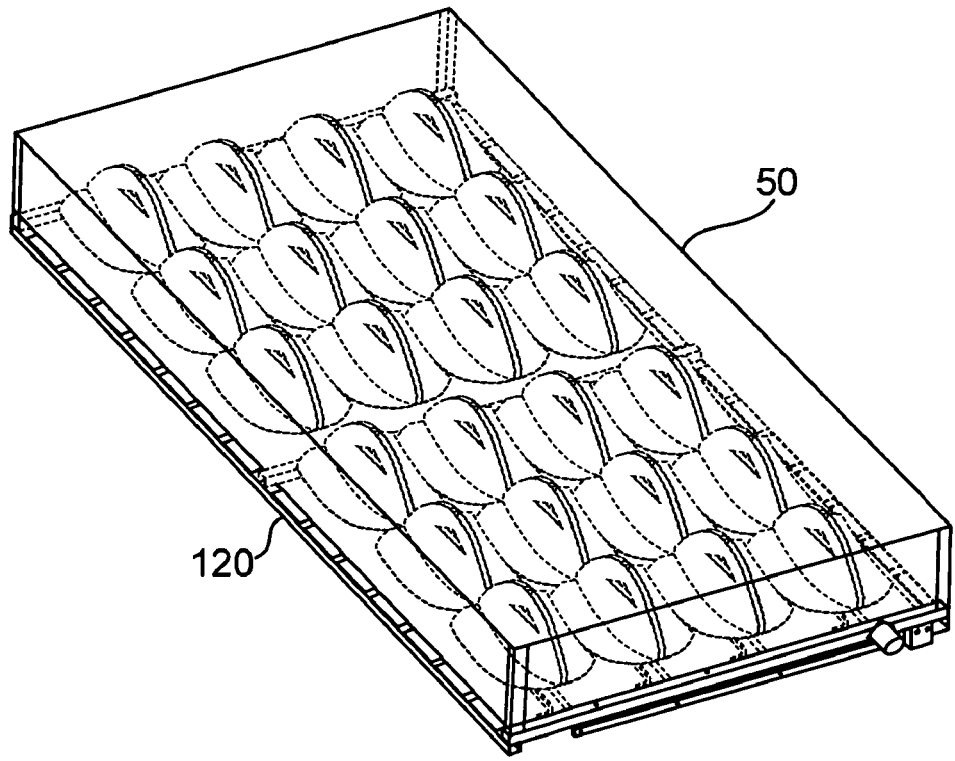
FIG. 11 shows an optional cover for the photovoltaic power system referred to in FIG. 5A.

FIG. 11 shows an optional protective transparent cover 50 for the photovoltaic power system 120 referred to in FIG. 5A. Cover 50 can be made of a material such as glass, polycarbonate, or acrylic. Cover 50 is desirably over the entire panel/unit.

Figure 12:
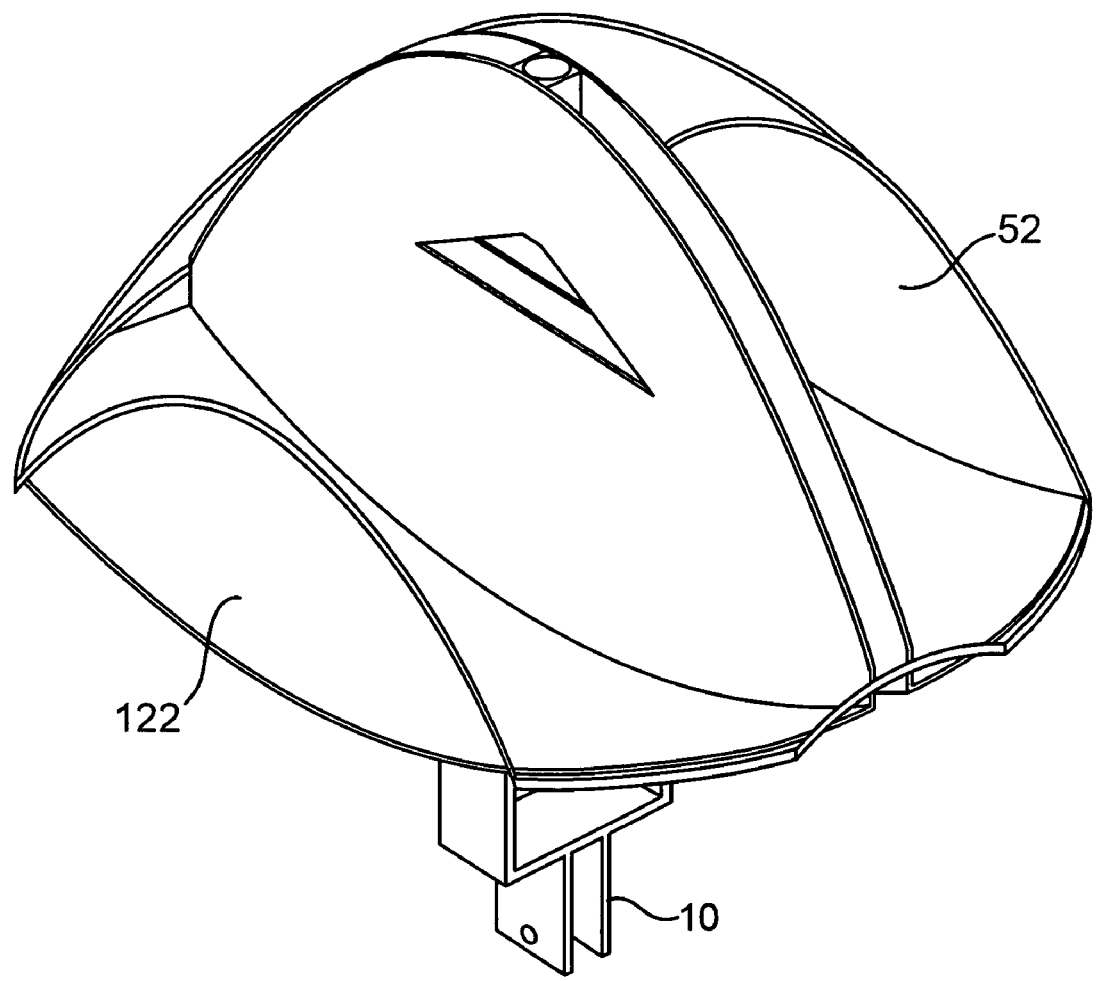
FIG. 12 shows an optional cover for the concentrator module illustrated in FIG. 5A.

FIG. 12 shows an optional protective transparent cover panel 52 over an individual concentrator module 122 illustrated in FIG. 5A. Cover panel 52 can be made of a material such as glass, polycarbonate, or acrylic. One or more individual concentrators 122 can be covered with a cover panel 52.

All cited patents and patent publications are incorporated herein by reference in their respective entireties for all purposes.

What is claimed is:

1. A photovoltaic power system, comprising:
   a) a support structure having at least one interface that is structured to mate with existing solar panel mounting hardware; and
   b) a plurality of photovoltaic concentrator modules coupled to the support structure such that a module is moveable and articulates in place relative to the support structure, each module comprising:
      i. at least one photovoltaic receiver; and
      ii. at least one optical concentrating element which optically concentrates incident light onto at least one corresponding photovoltaic receiver thereby defining a volume in which light rays converge from the optical concentrating element towards the photovoltaic receiver, and wherein a photovoltaic concentrator module further comprises a heat-dissipating element that is located at least partially within the volume in which light rays converge from the optical concentrating element towards the photovoltaic receiver.

2. The photovoltaic power system of claim 1, further comprising a source of self-power operatively coupled to the photovoltaic power system.

3. The photovoltaic power system of claim 2, wherein the source of self-power comprises at least one solar cell.

4. The photovoltaic power system of claim 2, wherein the source of self-power comprises a panel of solar cells.

5. The photovoltaic power system of claim 4, wherein the panel of solar cells is supported upon the support structure.

6. The photovoltaic power system of claim 2, wherein the source of self-power comprises at least one of the plurality of photovoltaic concentrator modules.

7. The photovoltaic power system of claim 6, wherein at least one module generates a power output at least at some times that the module is not tracking the sun.

8. The photovoltaic power system of claim 1, wherein the support structure is planar.

9. The photovoltaic power system of claim 1, wherein the support structure is rigid and planar.

10. The photovoltaic power system of claim 1, wherein the at least one optical concentrating element comprises an optical concentrating element selected from the group consisting of a reflector, a lens, a solar trap, and a reflective ring concentrator.

11. The photovoltaic power system of claim 1, wherein the heat-dissipating element comprises a heat-dissipating fin that is parallel to the optical axis of the optical concentrating element.

12. The photovoltaic power system of claim 1, wherein the heat-dissipating element comprises a plurality of fins oriented radially around the receiver.

13. The photovoltaic power system of claim 1, wherein substantially all of the heat-dissipating element is located within the volume in which light rays converge from the optical concentrating element towards the photovoltaic receiver.

14. The photovoltaic power system of claim 1, wherein the photovoltaic concentrator modules are spaced apart.

15. The photovoltaic power system of claim 1, wherein a plurality of the photovoltaic modules are ganged to move together in fixed relation to one another in at least one axis.

16. The photovoltaic power system of claim 1, wherein each of the plurality of modules is moveable and articulates in place relative to the support structure.

17. The photovoltaic power system of claim 16, wherein each of the plurality of modules move in synchrony.

18. The photovoltaic power system of claim 16, wherein the support structure is fixed relative to the plurality of articulating photovoltaic concentrator modules.

19. The photovoltaic power system of claim 1, wherein the at least one photovoltaic concentrator module individually articulates in place relative to the support structure.

20. A photovoltaic power system, comprising:
  a) a support structure;
  b) a plurality of photovoltaic concentrator modules supported by the support structure in a manner such that a module is independently moveable with respect to the support structure, each module comprising:
    i. at least one photovoltaic receiver;
    ii. at least one optical concentrating element that concentrates incident light onto at least one corresponding photovoltaic receiver thereby defining a volume in which light rays converge from the optical concentrating element towards the photovoltaic receiver; and
  c) a heat-dissipating element comprising at least one fin that is parallel to the optical axis of a module, wherein the heat dissipating element is located at least partially within the volume in which light rays converge from the optical concentrating element towards the photovoltaic receiver.

21. A photovoltaic concentrator module, comprising:
  a) at least one photovoltaic receiver that converts incident sunlight into electrical energy;
  b) at least one optical concentrating element that concentrates incident light onto the photovoltaic receiver thereby defining a volume in which light rays converge from the optical concentrating element towards the photovoltaic receiver; and
  c) a heat-dissipating element that is located at least partially within the volume in which light rays converge from the optical concentrating element towards the photovoltaic receiver.

22. The photovoltaic concentrator of claim 21, wherein the optical concentrating element is selected from the group consisting of a reflector, a lens, a solar trap, and a reflective ring concentrator.

23. The photovoltaic concentrator of claim 21, wherein the heat-dissipating element comprises a fin that is parallel to the optical axis of at least one optical concentrating element.

24. The photovoltaic concentrator of claim 21, wherein substantially all of the heat-dissipating element is located in the volume.

25. The photovoltaic concentrator of claim 21, wherein the heat-dissipating element comprises a plurality of fins oriented radially around the receiver.

26. A photovoltaic concentrator module assembly, comprising:
  a) a frame;
  b) an array of photovoltaic concentrator modules mounted to the frame in a manner such that at least one module is moveable and articulates in place relative to the frame, wherein each module comprises:
    i) at least one photovoltaic receiver that converts incident sunlight into electrical energy; and
    ii) at least one optical concentrating element that concentrates incident light to the photovoltaic receiver; and wherein at least one module further comprises a heat-dissipating element that is located at least partially within a volume in which light rays converge from the optical concentrating element towards the photovoltaic receiver; and
  c) a tracker system operatively coupled to the assembly, wherein the tracker system moves at least one of the modules based on a direction of incoming sunlight; and
  d) a source of power operatively coupled to the tracker system.

* * * * *